(12) United States Patent
Smith et al.

(10) Patent No.: US 7,324,370 B2
(45) Date of Patent: Jan. 29, 2008

(54) SYSTEM AND METHOD FOR DETERMINING THE VALUE OF A MEMORY ELEMENT

(75) Inventors: Kenneth K. Smith, Boise, ID (US); Richard L. Hilton, Boise, ID (US); Corbin L. Champion, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/212,936

(22) Filed: Aug. 25, 2005

(65) Prior Publication Data

US 2006/0002193 A1  Jan. 5, 2006

Related U.S. Application Data

(62) Division of application No. 10/662,643, filed on Sep. 15, 2003, now Pat. No. 6,970,387.

(51) Int. Cl.
*G11C 11/00* (2006.01)
(52) U.S. Cl. .................. 365/158; 365/171; 365/207

(58) Field of Classification Search ............... 365/158, 365/171, 189.01, 207
See application file for complete search history.

(56) References Cited

U.S. PATENT DOCUMENTS

| | | | |
|---|---|---|---|
| 6,678,187 B2 * | 1/2004 | Sugibayashi et al. ....... | 365/158 |
| 6,856,532 B2 * | 2/2005 | Baker ........................ | 365/97 |
| 6,901,005 B2 * | 5/2005 | Perner et al. ............... | 365/158 |
| 7,027,318 B2 * | 4/2006 | Smith et al. ................ | 365/158 |
| 2002/0018360 A1 | 2/2002 | Hartmann | |
| 2004/0032760 A1 | 2/2004 | Baker | |

* cited by examiner

*Primary Examiner*—Pho M. Luu

(57) ABSTRACT

A method for determining memory element values may include: selecting a column of interest containing a desired memory element, disabling the desired memory element, measuring a first current provided to the column of interest, adjusting measurement circuitry to compensate for skew introduced by undesired memory elements, enabling the desired memory element, and measuring a second current provided to the column of interest.

20 Claims, 4 Drawing Sheets

SYSTEM AND METHOD FOR DETERMINING THE VALUE OF A MEMORY ELEMENT

CROSS-REFERENCE TO RELATED APPLICATIONS

This is a divisional application of application Ser. No. 10/662,643, filed Sep. 15, 2003, now U.S. Pat. No. 6,970,387, issued Nov. 29, 2005, and is hereby incorporated by reference herein as if reproduced in full below.

BACKGROUND

In today's society, computers are ubiquitous. For example, computers may be found in grocery stores, automobiles, airplanes, watches, or other electronic devices. Often computers include a processor that executes various functions such as mathematical computations, running programs, and retrieving and storing information. A processor that retrieves and stores information may use a storage device such as a disk drive (e.g., hard disk) or memory. Generally, memory devices store information in binary form—i.e., 1s and 0s. This binary information may be stored by assigning differing voltage states to binary values. For example, a binary 0 may be assigned 0 volts, while a binary 1 may be assigned 5 volts. Traditionally, memory devices have been implemented using transistors configured to form logic gates that are able to store binary values. However, recent trends include memory devices implemented using an array of magnetic elements that are constructed using semiconductor processing techniques.

One embodiment of an array of magnetic memory elements may comprise individual magnetic memory elements formed by using two layers of magnetic material that have adjustable magnetic orientations. The magnetic materials may be formed with an insulating layer sandwiched between them. Because the magnetic materials are designed to be adjustable, the magnetic field for each material may be adjusted by applying electrical current in proximity to the material. The orientations of two magnetic layers may be in the same direction (termed "parallel"), or they may be opposite each other (termed "anti-parallel").

Each magnetic memory element may also have an electrical resistance. The electrical resistance of the magnetic memory element may vary depending on the parallel or anti-parallel orientation of the magnetic fields. For example, parallel orientation may yield a resistance of 1 MΩ whereas anti-parallel orientation may produce a resistance of 1.1 MΩ. Because the resistance of the magnetic memory element may be changed, binary values (e.g., 1s and 0s) may be associated with the electrical resistance. Circuitry may be used to estimate the resistive value of the memory elements, and consequently determine the memory element's digital value. For one or more reasons, estimations for the resistive value of an individual memory element within the memory array may be inaccurate, which may then cause the digital value to be inaccurately determined.

SUMMARY

In one exemplary embodiment, a method for determining the memory element values is disclosed. In some embodiments the method may include: selecting a column of interest containing a desired memory element, disabling the desired memory element, measuring a first current provided to the column of interest, adjusting measurement circuitry to compensate for skew introduced by undesired memory elements, enabling the desired memory elements, and measuring a second current provided to the column of interest.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

The term "magneto-resistive element" is intended to refer to an element whose electrical resistance varies as a function of the magnetic field induced on the element.

DETAILED DESCRIPTION OF THE EMBODIMENTS

The following discussion is directed to various embodiments of the invention. Although one or more of these embodiments may be preferred, the embodiments disclosed should not be interpreted or otherwise used as limiting the scope of the disclosure, including the claims. In addition, one skilled in the art will understand that the following description has broad application, and the discussion of any embodiment is meant only to be exemplary, and is not intended to intimate that the scope of the disclosure, including the claims, is limited to these embodiments.

Figure 1:
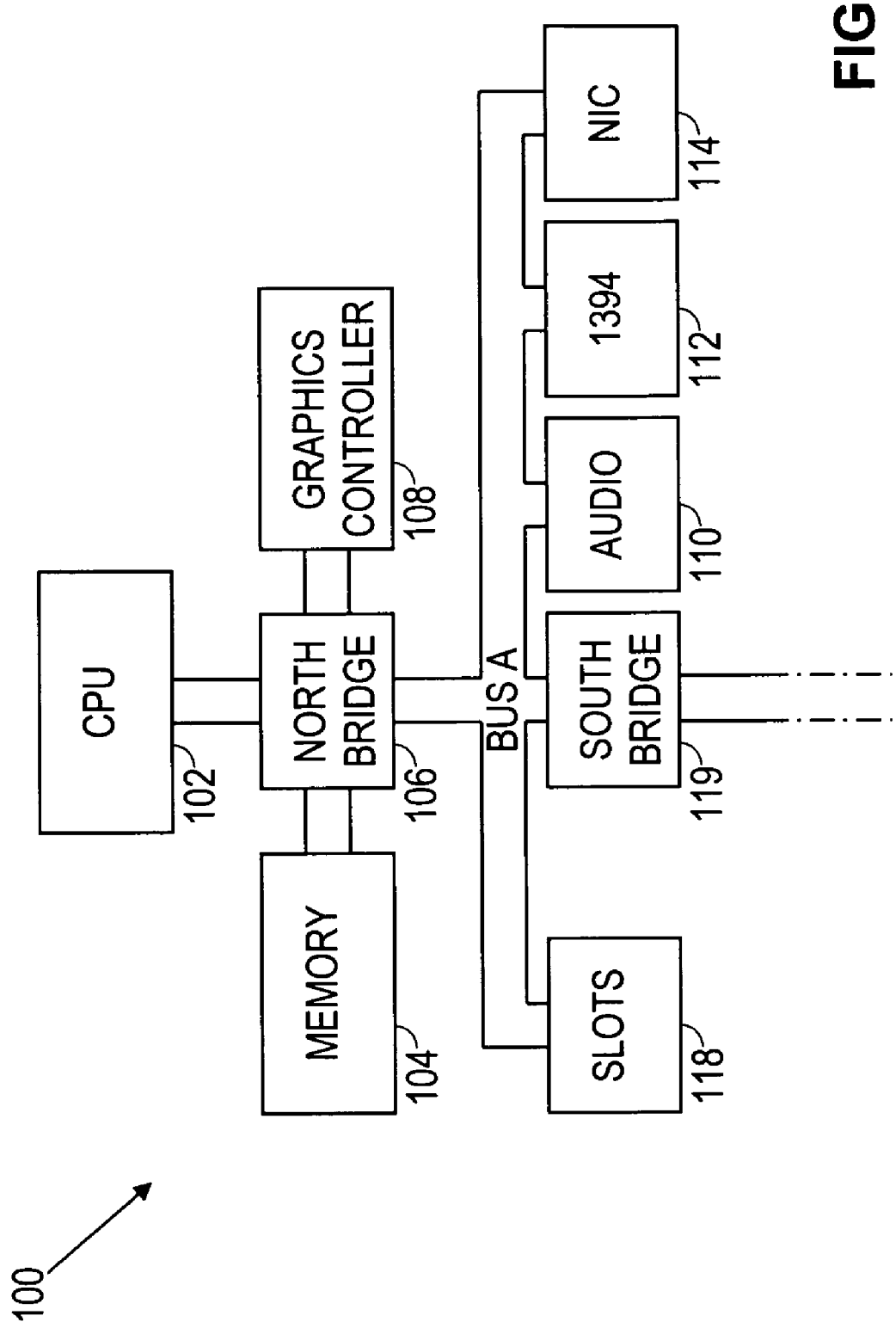
FIG. 1 shows a computer system in accordance with various embodiments.

FIG. 1 illustrates an exemplary computer system 100. The computer system of FIG. 1 includes a central processing unit ("CPU") 102 that may be electrically coupled to a bridge logic device 106 via a CPU bus. The bridge logic device 106 is sometimes referred to as a "North bridge." The North bridge 106 electrically couples to a main memory array 104 by a memory bus, and may further electrically couple to a graphics controller 108 via an advanced graphics processor ("AGP") bus. Note that the main memory array 104 may include magnetic memory array utilizing the methods for determining memory element values disclosed below. The North bridge 106 may couple CPU 102, memory 104, and graphics controller 108 to the other peripheral devices in the system through, for example, a primary expansion bus ("BUS A") such as a PCI bus or an EISA bus. Various components that operate using the bus protocol of BUS A may reside on this bus, such as an audio device 110, an IEEE 1394 interface device 112, and a network interface card ("NIC") 114. These components may be integrated onto the motherboard, as suggested by FIG. 1, or they may be plugged into expansion slots 118 that are connected to BUS A. If other secondary expansion buses are provided in the computer system, another bridge logic device 119 may be used to electrically couple the primary expansion bus, BUS A, to a secondary expansion bus ("BUS B"). This bridge logic 119 is sometimes referred to as a "South bridge."

Figure 2B:
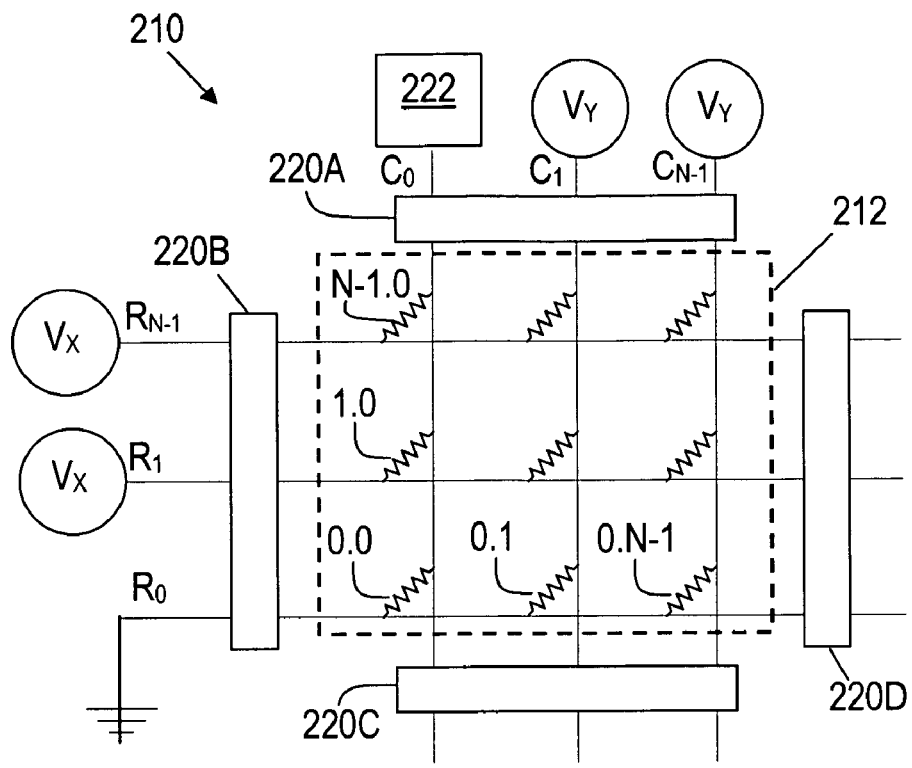
FIG. 2B shows selection of a desired memory element in accordance with various embodiments.
Figure 2A:
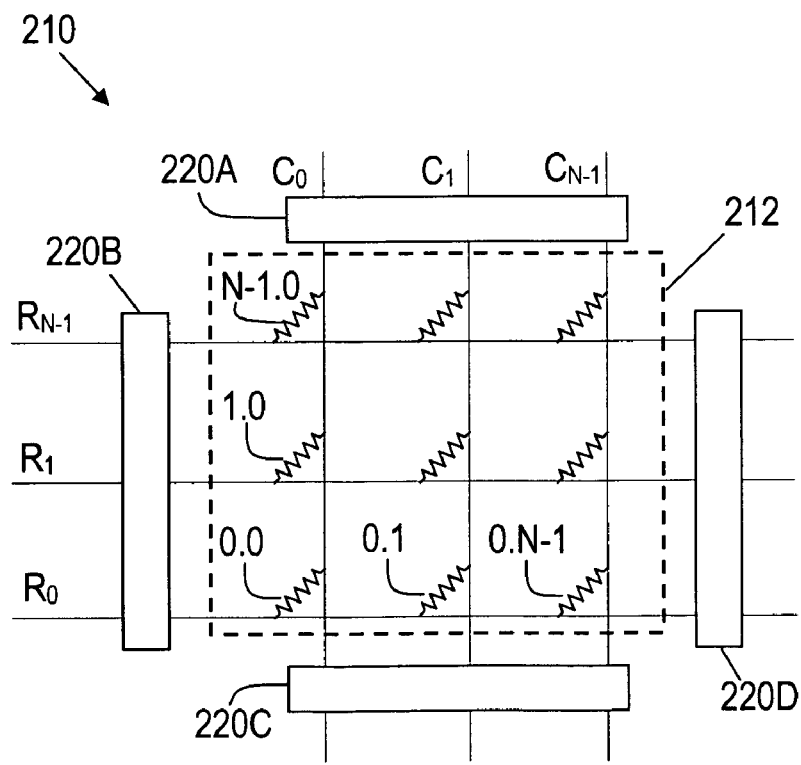
FIG. 2A shows a memory array in accordance with various embodiments.

FIG. 2A shows a schematic representation of magnetic memory array 210, which may be implemented in memory array 104. Memory array 210 may include magnetic memory elements 212. Memory elements 212 may be arranged in an array of columns $C_0$-$C_{N-1}$ and rows $R_0$-$R_{N-1}$. Individual memory elements may be depicted as resistive elements interconnecting rows and columns as shown. For example, memory element "0.0" would represent the memory element that is located at the intersection of row $R_0$ and column $C_0$. Note that the magnetic memory elements may be modeled using a variety of devices such as capacitors, resistors, inductors, tunnel junctions in series with diodes, or other combinations of integrated circuit elements.

Accompanying circuitry 220A-D may write data to and read data from the memory elements 212. Digital values may be written in memory array 210 by setting the resistance of the memory elements 212, where various resistive values may be assigned to various digital values. For example, memory element 0.0 may contain a resistance of 1 MΩ for a digital '1' or 1.1 MΩ for a digital '0', although the resistances may vary as desired. In addition, each memory element may be capable of being set to several distinct resistive values so that there may be N distinct data values represented by each memory element for N distinct resistive states. For example, memory element 0.0 may be set to four distinct resistive values, such as 1.0MΩ, 1.1MΩ, 1.2MΩ, and 1.3MΩ, so that memory element 0.0 may be able to represent four distinct digital values—e.g., 00, 01, 10, and 11, respectively.

In order to determine the digital value contained in a memory element, voltage sources may be coupled to the rows R and columns C of memory array 210, as shown in FIG. 2B. Coupling voltage sources to the array as shown offers the ability to isolate desired memory elements from undesired memory elements, while also allowing the digital value of the desired memory element to be determined. For example, memory element 0.0 may be isolated and read by coupling voltage source $V_Y$ to columns $C_0$-$C_{N-1}$, voltage source $V_X$ to rows $R_1$-$R_{N-1}$, and ground to row $R_0$ as shown. A voltage equivalent to voltage source $V_Y$ may be provided to column $C_0$ by read circuitry 222. If $V_Y$ and $V_X$ are equal, then memory elements 1.0 through N-1.0 may be isolated from memory element 0.0, which may have $V_Y$ across it. With memory element 0.0 isolated from the other memory elements in the same column, the current supplied to column $C_0$ may represent the resistance of memory element 0.0, so that the digital value of memory element 0.0 may be determined by measuring the current in column $C_0$. In addition to providing voltage source $V_Y$ to column $C_0$, read circuitry 222 may be used to measure the current supplied to column $C_0$. However, $V_Y$ and $V_X$ may not be equal to each other and therefore the current supplied to column $C_0$ may also represent current in undesired memory elements, such as memory elements 1.0 through N-1.0.

Figure 3:
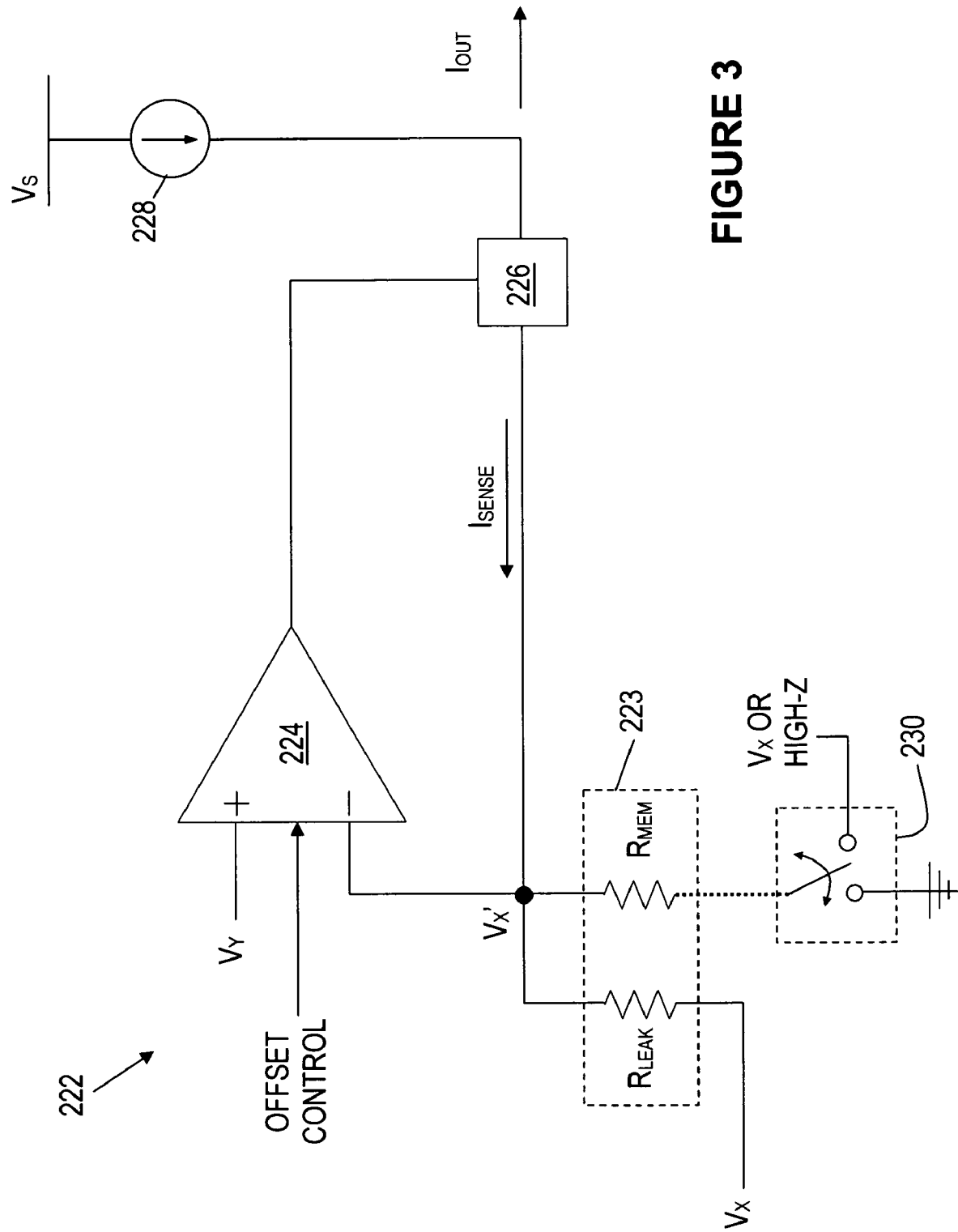
FIG. 3 shows circuitry for reading a desired memory element in accordance with various embodiments.

FIG. 3 shows an exemplary implementation of read circuitry 222 coupled to one or more memory elements 223. Circuitry 222 may be included in accompanying circuitry 220A-D (FIGS. 2A and 2B). Referring to FIG. 3, memory elements 223 may include a desired memory element (i.e., a memory element that is to be measured), as well as other undesired memory elements (i.e., memory elements that may impact the measurement of the desired memory element). The desired memory elements may be represented by resistance $R_{MEM}$, while the undesired memory elements may be represented by resistance $R_{LEAK}$. A gain stage 224 may have its negative input coupled to the memory elements 223, its positive input coupled to a predetermined voltage $V_Y$, and its output coupled to a controller 226, where the controller 226 forms a negative feedback loop. Controller 226 may be used to vary the amount of current in the feedback loop, where gain stage 224 may determine the amount of current that controller 226 shall provide.

The undesired memory elements $R_{LEAK}$ may have one terminal coupled to the negative terminal of gain stage 224, which may be at a voltage potential $V_X'$ as indicated in FIG. 3, and its other terminal coupled to voltage source $V_X$. The desired memory element may have one terminal coupled to the negative terminal of gain stage 224 and the other terminal coupled to a switch 230. The gain stage 224 may attempt to maintain equal potentials at its positive and negative input nodes—i.e., $V_Y$ equal to $V_X'$. The switch 230 may couple the desired memory element $R_{MEM}$ to ground or may couple the desired memory element $R_{MEM}$ to some other known state, such as voltage source $V_X$ or high a impedance state. A current source 228 may also be coupled between a voltage supply $V_S$ and the controller 226.

With the gain stage 224 configured in a negative feedback arrangement as shown in FIG. 3, a voltage of approximately equal to voltage source $V_X$, indicated by $V_X'$, may be established at the negative input of the gain stage 224. The voltages present at the input terminals may not be equal for various reasons including input offset errors of the gain stage 224. In establishing $V_X'$ at the negative node of gain stage 224, the controller 226 may moderate the current flowing from current source 228. The controller 226 may be a metal oxide semiconductor transistor ("MOSFET"). The amount of current necessary to establish $V_X'$ at the negative input terminal may be designated as $I_{SENSE}$. Under normal memory operation, the switch 230 may couple the desired memory element $R_{MEM}$ to ground. If $V_X'$ and $V_Y$ are equal to each other, the undesired memory elements $R_{LEAK}$ may conduct a minimal amount of current (e.g., 1 nA) and may therefore be isolated from the desired memory element $R_{MEM}$. In this manner, $I_{SENSE}$ may be primarily provided to $R_{MEM}$ and may indicate the resistance and digital value of the desired memory element $R_{MEM}$.

In some situations, it may be difficult to generate matching voltages for $V_Y$ and $V_X'$. If $V_X'$ and $V_Y$ are not equal, then a portion of $I_{SENSE}$ may be provided to $R_{LEAK}$, and consequently the digital value of the desired memory element $R_{MEM}$ may be skewed by the undesired memory elements $R_{LEAK}$. Using switch 230, the amount of skew introduced by the undesired memory elements $R_{LEAK}$ may be characterized and compensated for if necessary, so that $I_{SENSE}$ may be used to accurately determine the digital value of $R_{MEM}$. Note that this compensation may be made prior to or after measurement of $I_{SENSE}$. For example, gain stage 224 may have its offset voltage adjusted to compensate for skew prior to measuring $I_{SENSE}$, or $I_{SENSE}$ may be measured and a correction factor may be added or subtracted from $I_{SENSE}$ to correct for the amount of skew. $I_{SENSE}$ may be measured at the junction between the current source 228 and the switch 226, as indicated by $I_{OUT}$.

Additionally, read circuitry 222 may include detection circuitry (not specifically shown in FIG. 3) that measures the difference in the magnitude of $I_{SENSE}$ with switch 230 in various conducting states. For example, when switch 230 couples the desired memory element $R_{MEM}$ to ground, the magnitude of $I_{SENSE}$ may be 1.5 µA, with 1 µA flowing in $R_{LEAK}$ and 0.5 µA flowing in $R_{MEM}$—i.e., $R_{MEM}$ enabled. Alternatively, when switch 230 couples the desired memory element $R_{MEM}$ to $V_X$, the magnitude of $I_{SENSE}$ may be 1.01 µA, with 1 µA flowing in $R_{LEAK}$ and 0.01 µA flowing in $R_{MEM}$—i.e., $R_{MEM}$ disabled. In this example, the detection circuitry may note a 0.49 µA difference between the two values of $I_{SENSE}$. Consequently, this difference may be compared to a predetermined difference amount, and then may represent the digital value of $R_{MEM}$. For example, a digital '1' may be represented by a difference current measurement in the range of 0.45 µA to 0.60 µA, and therefore a 0.49 µA difference may indicate a digital '1'.

In addition, read circuitry may monitor the current in the desired memory element and determine the derivative of the current while the desired memory element $R_{MEM}$ is being switched. In this manner, the peak value of the derivative may indicate the digital value of $R_{MEM}$.

In at least some embodiments, the current in the undesired memory elements $R_{LEAK}$ should be less than or equal to about five times the current in the desired memory elements $R_{MEM}$.

Figure 4:
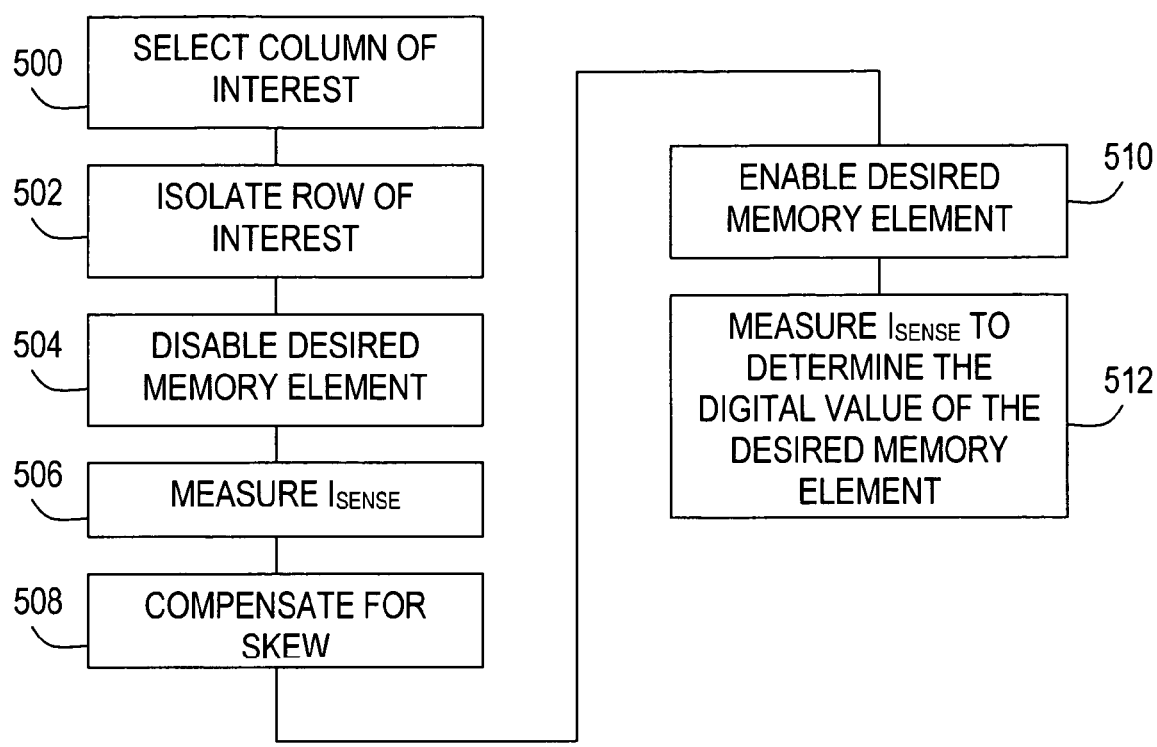
FIG. 4 shows a method for determining the value of a desired memory element in accordance with various embodiments.

FIG. 4 illustrates a possible method for determining the digital value of a desired memory element $R_{MEM}$. A column of interest, which may contain the desired memory element $R_{MEM}$, may be selected from within the memory elements 212 by coupling a voltage $V_Y$ to the appropriate columns of memory elements 212 as shown in block 500. This may include coupling read circuitry 222 to the column of interest containing the desired memory element $R_{MEM}$, where, read circuitry 222 may provide the voltage $V_Y$ to the column of interest. Note that read circuitry 222 may measure the amount of current $I_{SENSE}$ provided to the column of interest in order to determine the digital value of the desired memory element $R_{MEM}$. A row of interest, which may contain the desired memory element $R_{MEM}$, may be isolated from other rows by coupling voltages $V_X$ (and thereby generating $V_X{'}$) to the rows which do not contain the desired memory element $R_{MEM}$ as shown in block 502. Because voltage $V_X{'}$ may not equal $V_Y$ the undesired memory elements $R_{LEAK}$ may conduct current and the current $I_{SENSE}$ measured by the read circuitry 222 may not accurately reflect the digital value of the desired memory element $R_{MEM}$. Switch 230 may disable the desired memory element $R_{MEM}$ by coupling it to $V_X$ or to a high impedance state as shown in block 504.

With the desired memory element $R_{MEM}$ coupled to voltage $V_X$ or to a high impedance state, the desired memory element $R_{MEM}$ may be isolated so that amount of current in the undesired memory elements $R_{LEAK}$ may be characterized by measuring the current $I_{SENSE}$ as shown in block 506. In block 508, the amount of skew introduced by the undesired memory elements $R_{LEAK}$ may be compensated for by using various techniques—e.g., adjusting the input offset voltage of gain stage 224. As shown in FIG. 3, gain stage 224 may include an external control line for making the input offset adjustment. The desired memory element $R_{MEM}$ may be enabled by coupling it to ground using switch 230 as shown in block 510. With the desired memory element $R_{MEM}$ enabled, read circuitry 222 may measure $I_{SENSE}$ as shown in block 512. Measuring the current $I_{SENSE}$ after the compensating for the current consumed by the undesired memory elements $R_{LEAK}$ may allow the digital value of the desired memory element $R_{MEM}$ to be accurately determined.

Note that the above discussion and Figures address the situation where $V_X{'}$ may be at a lower potential than $V_Y$, and therefore the current in the undesired memory elements $R_{LEAK}$ may flow from the negative terminal of gain stage 224 to voltage source $V_X$. However, $V_X{'}$ may be at a higher potential than $V_Y$, and therefore the current in the undesired memory elements $R_{LEAK}$ may flow from $V_X$ to the negative terminal of gain stage 224. Accordingly, the methods, memory systems, and circuitry described above for compensating for the current in the undesired memory elements $R_{LEAK}$ may be used regardless of the direction of the current in the undesired memory elements $R_{LEAK}$.

The above discussion is meant to be illustrative of the principles and various embodiments of the present invention. Numerous variations and modifications will become apparent to those skilled in the art once the above disclosure is fully appreciated. For example, the switch 230 may be implemented using a tri-state buffer. Accordingly, aspects of the embodiments may be combined together in various forms to achieve desirable results. It is intended that the following claims be interpreted to embrace all such variations and modifications.

What is claimed is:

1. A memory, comprising:
   a plurality of memory elements comprising a desired memory element and undesired memory elements;
   a switch for coupling the desired memory element to a plurality of known states;
   a gain stage coupled to the plurality of memory elements; and
   a controller coupled to the plurality of memory elements and the gain stage;
   wherein the controller is capable of providing a current to the plurality of memory elements;
   wherein the gain stage is capable of establishing a voltage at the plurality of memory elements by modulating the amount of current provided by the controller.

2. The memory of claim 1, wherein a rate of change in the current is indicative of a digital value of the desired memory element.

3. The memory of claim 1, wherein the known state is a high impedance state.

4. The memory of claim 3, wherein the current provided by the controller is measured to determine the amount of skew contributed by the undesired memory elements.

5. The memory of claim 4, wherein the gain stage is compensated to account for the skew caused by the undesired memory elements.

6. The memory of claim 1, wherein the known state is ground.

7. The memory of claim 1, wherein the gain stage has been compensated to account for skew caused by the undesired memory elements.

8. The memory of claim 7, wherein the current provided by the controller corresponds to the digital value of the memory element.

9. The memory of claim 7, wherein compensating the gain stage includes adjusting its input offset voltage.

10. The memory of claim 1, wherein the switch comprises a tri-state buffer.

11. The memory of claim 1, wherein the plurality of memory elements further comprise magnetic memory elements.

12. The memory of claim 11, wherein the plurality of memory elements further comprise magneto-resistive memory elements.

13. The memory of claim 1, wherein the plurality of known states include a state where the desired memory element is enabled and a state where the desired memory element is disabled.

14. The memory of claim 13, wherein the difference in the magnitude of current provided by the controller with the desired memory element in the enabled and disabled states correlates to the digital value of the desired memory element.

15. A computer system, comprising:
a central processing unit ("CPU");
a memory device coupled to the CPU, wherein the memory comprises:
  a plurality of memory elements comprising a desired memory element and undesired memory elements;
  a switch for coupling the desired memory element to a plurality of known states;
  a gain stage coupled to the plurality of memory elements; and
  a controller coupled to the plurality of memory elements and the gain stage wherein the controller is capable of providing a current to the plurality of memory elements;
  wherein the gain stage may establish a voltage at the plurality of memory elements by modulating the amount of current provided by the controller.

16. The computer of claim 15, wherein the plurality of known states include a state where the desired memory element is enabled and a state where the desired memory element is disabled.

17. The computer of claim 16, further comprising a switch for coupling the desired memory element to a plurality of known states, wherein the plurality of known states include a state where the desired memory element is enabled and a state where the desired memory element is disabled, and wherein the difference in the magnitude of current provided by the controller with the desired memory element in the enabled state and the magnitude of current provided by the controller with the desired memory element in the disabled state correlates to the digital value of the desired memory element.

18. A memory, comprising:
a plurality of memory elements including a desired memory element and undesired memory elements;
means for coupling the desired memory element to a plurality of known states;
means for providing a current to the plurality of memory elements; and
means for establishing a voltage at the plurality of memory elements by modulating the current provided by the means for providing current.

19. The memory of claim 18, further comprising a means for isolating the desired memory element from the undesired memory elements.

20. The memory of claim 19, further comprising a means for determining the digital value of the desired memory.

* * * * *

UNITED STATES PATENT AND TRADEMARK OFFICE
CERTIFICATE OF CORRECTION

| | | |
|---|---|---|
| PATENT NO. | : 7,324,370 B2 | Page 1 of 1 |
| APPLICATION NO. | : 11/212936 | |
| DATED | : January 29, 2008 | |
| INVENTOR(S) | : Kenneth K. Smith et al. | |

It is certified that error appears in the above-identified patent and that said Letters Patent is hereby corrected as shown below:

In column 7, line 30, in Claim 16, after "computer" insert -- system --.

In column 8, line 1, in Claim 17, after "computer" insert -- system --.

Signed and Sealed this

Twenty-second Day of July, 2008

JON W. DUDAS
*Director of the United States Patent and Trademark Office*